United States Patent
Datta et al.

(10) Patent No.: US 7,626,236 B2
(45) Date of Patent: Dec. 1, 2009

(54) TRANSISTOR INCLUDING PARAMAGNETIC IMPURITIES AND HAVING ANTI-PARALLEL FERROMAGNETIC CONTACTS

(75) Inventors: Supriyo Datta, West Lafayette, IN (US); Sayeef Salahuddin, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 205 days.

(21) Appl. No.: 11/427,224

(22) Filed: Jun. 28, 2006

(65) Prior Publication Data
US 2007/0069244 A1    Mar. 29, 2007

Related U.S. Application Data

(60) Provisional application No. 60/694,933, filed on Jun. 28, 2005.

(51) Int. Cl.
*H01L 29/96* (2006.01)
(52) U.S. Cl. ............... 257/410; 257/421; 257/E29.323; 977/933; 977/936
(58) Field of Classification Search ......... 977/933, 977/934, 935, 936; 257/410, 721, E29.323
See application file for complete search history.

(56) References Cited

U.S. PATENT DOCUMENTS 5,654,566 A * 8/1997 Johnson ................ 257/295
6,069,820 A * 5/2000 Inomata et al. ......... 365/171
2004/0061981 A1 * 4/2004 Covington ............ 360/324.1
2004/0113188 A1 * 6/2004 Schmidt et al. .......... 257/295

OTHER PUBLICATIONS

Uchino et al. "Model of a Switching Oxide Trap in Amorphous Silicon Dioxide." (Aug. 8, 2001) Physical Review B, vol. 64, 08131(R), pp. 1-4.*
Xiao, M. et al. Electrical Detection of the Spin Resonance of a Single Electron in a Silicon Field-Effect Transistor, Jul. 22, 2004, pp. 435-439, vol. 430, Nature Publishing Group, US.

* cited by examiner

*Primary Examiner*—Minh-Loan T Tran
*Assistant Examiner*—W. Wendy Kuo
(74) *Attorney, Agent, or Firm*—Barnes & Thornburg LLP (57) ABSTRACT

A transistor device may comprise a source having a first ferromagnetic contact thereto, a drain having a second ferromagnetic contact thereto, an electrically conductive gate positioned over a channel region separating the source and the drain, and an electrically insulating layer disposed between the gate and the channel region. The first and second ferromagnetic contacts have anti-parallel magnetic orientations relative to each other. The electrically insulating layer includes a number of paramagnetic impurities each having two spin states such that electrons interacting with the paramagnetic impurities cause the paramagnetic impurities to flip between the two spin states.

23 Claims, 3 Drawing Sheets

TRANSISTOR INCLUDING PARAMAGNETIC IMPURITIES AND HAVING ANTI-PARALLEL FERROMAGNETIC CONTACTS

CROSS-REFERENCE TO RELATED U.S. PATENT APPLICATION

This patent application claims priority to, and the benefit of, provisional patent application Ser. No. 60/694,933, filed Jun. 28, 2005, the disclosure of which is incorporated herein by reference.

STATEMENT REGARDING FEDERALLY SPONSORED RESEARCH OR DEVELOPMENT

Part of the work during the development of this invention was made with government support from the Army Research Office (ARO) and the Defense Advanced Research Projects Agency (DARPA) under grant number DAAD 19-99-1-019B. The U.S. Government has certain rights in the invention.

FIELD OF THE INVENTION

The present invention relates generally to field effect transistors, and more specifically to such transistors including paramagnetic or spin-flip impurities and having anti-parallel ferromagnetic contacts.

BACKGROUND

It is generally known that conventional FETs may include one or more paramagnetic defects in the gate oxide and/or at the gate oxide-semiconductor interface in the form of electron traps. Under certain operating conditions, a paramagnetic defect may randomly assume either of two possible trapped electric charge states that correspond to two possible spin orientations of an electron trapped in the defect. Spin flips between the two spin orientations may be converted by the FET to electric charge, which may be detected as a corresponding change in the source/drain current.

Semiconductor devices employing magnetic spin transport are also known. Such devices typically include at least one ferromagnet-semiconductor interface whereby current entering the semiconductor through the interface generally has a net spin polarization. Field effect transistors (FETs) incorporating such spin injection effects may typically include, for example, a source and a drain each electrically contacting a different ferromagnetic film, and it is known to selectively orient the magnetization of one of the films, e.g. the drain film, to be parallel or anti-parallel relative to the magnetization of the other film, e.g. the source film.

SUMMARY

The present invention may comprise one or more of the features recited in the attached claims, and/or one or more of the following features and combinations thereof. A transistor device may comprise a first semiconductor region and a first ferromagnetic member electrically contacting the first semiconductor region. The first ferromagnetic member may have a first coercivity. A second ferromagnetic member may electrically contact a second semiconductor region separate from the first semiconductor region. The second ferromagnetic member may have a second coercivity that is smaller than the first coercivity. A third semiconductor region may separate the first and second semiconductor regions. An electrically conductive gate may be positioned over the third semiconductor region. An electrically insulating layer may be disposed between the gate and the third semiconductor region. The electrically insulating layer may include a number of paramagnetic impurities each having two spin states such that electrons interacting with the paramagnetic impurities cause the paramagnetic impurities to flip between the two spin states.

The transistor device may further comprise means for coupling a magnetic field to the second ferromagnetic member to orient a magnetic orientation of the second ferromagnetic member in an anti-parallel magnetic orientation relative to a magnetic orientation of the first ferromagnetic member.

The electrical contact between the first ferromagnetic member and the first semiconductor region may comprise a high resistance contact, and the electrical contact between the second ferromagnetic member and the second semiconductor region may comprise a high resistance contact. Alternatively, the electrical contact between the first ferromagnetic member and the first semiconductor region may comprise a low resistance contact, and the electrical contact between the second ferromagnetic member and the second semiconductor region comprises a low resistance contact A first voltage source may be configured to apply a first voltage to the gate that induces an electrically conductive channel in the third semiconductor region that extends between the first and second semiconductor regions. A second voltage source may be configured to apply a second voltage across the first and second semiconductor regions to cause a current to flow through the electrically conductive channel between the first and second semiconductor regions. The current may have a magnitude that is sensitive to a degree of flipping of the paramagnetic impurities between the two spin states. The second voltage may be selected to cause the number of paramagnetic impurities to become spin polarized so that a magnitude of the current decreases from a first value before the number of paramagnetic impurities are spin polarized to a second value after the number of paramagnetic impurities are spin polarized. The transistor device may form a memory element with the first value of the current corresponding to one logic state of the memory element and the second value of the current corresponding to an opposite logic state of the memory element.

Subsequent depolarization of the number of paramagnetic impurities may induce a current to flow through the channel region between the first and second semiconductor regions. The transistor device may comprise one component of an electrical circuit having an electrical load, and the induced current may be directed from the transistor device to the electrical load.

A transistor device may comprise a source having a first ferromagnetic contact thereto and a drain having a second ferromagnetic contact thereto. The first and second ferromagnetic contacts may have anti-parallel magnetic orientations relative to each other. An electrically conductive gate may be positioned over a channel region separating the source and the drain. An electrically insulating layer may be disposed between the gate and the channel region. The electrically insulating layer may include a number of paramagnetic impurities each having two spin states such that electrons interacting with the paramagnetic impurities cause the paramagnetic impurities to flip between the two spin states.

The current flowing between the source and the drain may have a magnitude that is sensitive to a degree of flipping of the paramagnetic impurities between the two spin states. Application of a voltage across the source and the drain may cause the number of paramagnetic impurities to become spin polarized so that a magnitude of a current flowing through the channel region between the source and the drain decreases from a first value before the number of paramagnetic impurities are spin polarized to a second value after the number of paramagnetic impurities are spin polarized. Subsequent depolarization of the number of paramagnetic impurities may induce current flow through the channel region between the source and the drain.

The transistor device may further comprise means for coupling a magnetic field to the second ferromagnetic contact to orient a magnetic orientation of the second ferromagnetic member in an anti-parallel magnetic orientation relative to a magnetic orientation of the first ferromagnetic member.

The electrical contact between the source and the first ferromagnetic contact may comprise a high resistance contact, and the electrical contact between the drain and the second ferromagnetic contact may comprise a high resistance contact. Alternatively, the electrical contact between the source and the first ferromagnetic contact may comprise a low resistance contact, and the electrical contact between the drain and the second ferromagnetic contact may comprise a low resistance contact.

A first voltage source may be configured to apply a first voltage to the gate that induces an electrically conductive channel in the channel region that extends between the source and the drain. A second voltage source may be configured to apply a second voltage between the source and the drain to cause a current to flow through the electrically conductive channel between the source and the drain. The current may have a magnitude that is sensitive to a degree of flipping of the paramagnetic impurities between the two spin states. The second voltage may cause the number of paramagnetic impurities to become spin polarized so that a magnitude of the current decreases from a first value before the number of paramagnetic impurities are spin polarized to a second value after the number of paramagnetic impurities are spin polarized. The transistor device may comprise a memory element with the first value of the current defining one logic state of the memory element and the second value of the current defining an opposite logic state of the memory element.

Subsequent depolarization of the number of paramagnetic impurities may induce a current to flow through the conductive channel between the source and the drain.

The transistor device may comprise one component of an electrical circuit having an electrical load, and the induced current may be directed from the transistor device to the electrical load. The transistor device may comprise a memory element with the current flowing through the conductive channel defining one logic state of the memory element and negligible current flowing through the conductive channel defining an opposite state of the memory element.

A field effect transistor may having a source, a drain, a channel region defined between the source and the drain, separate ferromagnetic layers electrically contacting each of the source and the drain, an electrically conductive gate positioned over the channel region and an electrically insulating layer disposed between the gate and the channel region, wherein the electrical insulating layer includes a number of paramagnetic impurities each having two spin states such that electrons interacting with the paramagnetic impurities cause the paramagnetic impurities to flip between the two spin states. A method of operating such a field effect transistor may comprise orienting magnetic orientations of the separate ferromagnetic layers in an anti-parallel magnetic orientation relative to each other, applying a first voltage to the gate to induce an electrically conductive channel in the channel region that extends between the source and the drain, and applying a second voltage between the source and the drain to cause a current to flow through the electrically conductive channel, the current having a magnitude that is sensitive to a degree of flipping of the paramagnetic impurities between the two spin states.

Another method of operating such a field effect transistor may comprise orienting magnetic orientations of the separate ferromagnetic layers in an anti-parallel magnetic orientation relative to each other, applying a first voltage to the gate to induce an electrically conductive channel in the channel region that extends between the source and the drain, and applying a second voltage between the source and the drain to cause the number of paramagnetic impurities to become spin polarized so that a magnitude of a current flowing through the electrically conductive channel decreases from a first value before the number of paramagnetic impurities are spin polarized to a second value after the number of paramagnetic impurities are spin polarized. The method may further comprise implementing the transistor device as a memory element with the first value of the current flowing through the electrically conductive channel defining one logic state of the memory element and the second value of the current flowing through the electrically conductive channel defining an opposite logic state of the memory element.

Yet another method of operating such a field effect transistor may comprise orienting magnetic orientations of the separate ferromagnetic layers in an anti-parallel magnetic orientation relative to each other, applying a first voltage to the gate to induce an electrically conductive channel in the channel region that extends between the source and the drain, and applying a second voltage between the source and the drain to cause the number of paramagnetic impurities to become spin polarized such that subsequent depolarization of the number of paramagnetic impurities induces current flow in the conductive channel between the source and the drain. The method may further comprise implementing the transistor device as a capacitor, charging the capacitor by applying the second voltage between the source and the drain to cause the number of paramagnetic impurities to become spin polarized so that a magnitude of a current flowing through the electrically conductive channel decreases from a first value before the number of paramagnetic impurities are spin polarized to a second value after the number of paramagnetic impurities are spin polarized, and discharging the capacitor by removing the second voltage and directing the current flow induced in the conductive channel by subsequent depolarization of the number of paramagnetic impurities through an electrical load.

Alternatively or additionally, the method may further comprise implementing the transistor device as a memory element with the current flowing through the conductive channel defining one logic state of the memory element and negligible current flowing through the conductive channel defining an opposite state of the memory element.

DESCRIPTION OF THE ILLUSTRATIVE EMBODIMENTS

For the purposes of promoting an understanding of the principles of the invention, reference will now be made to a number of illustrative embodiments shown in the attached drawings and specific language will be used to describe the same.

Figure 1:
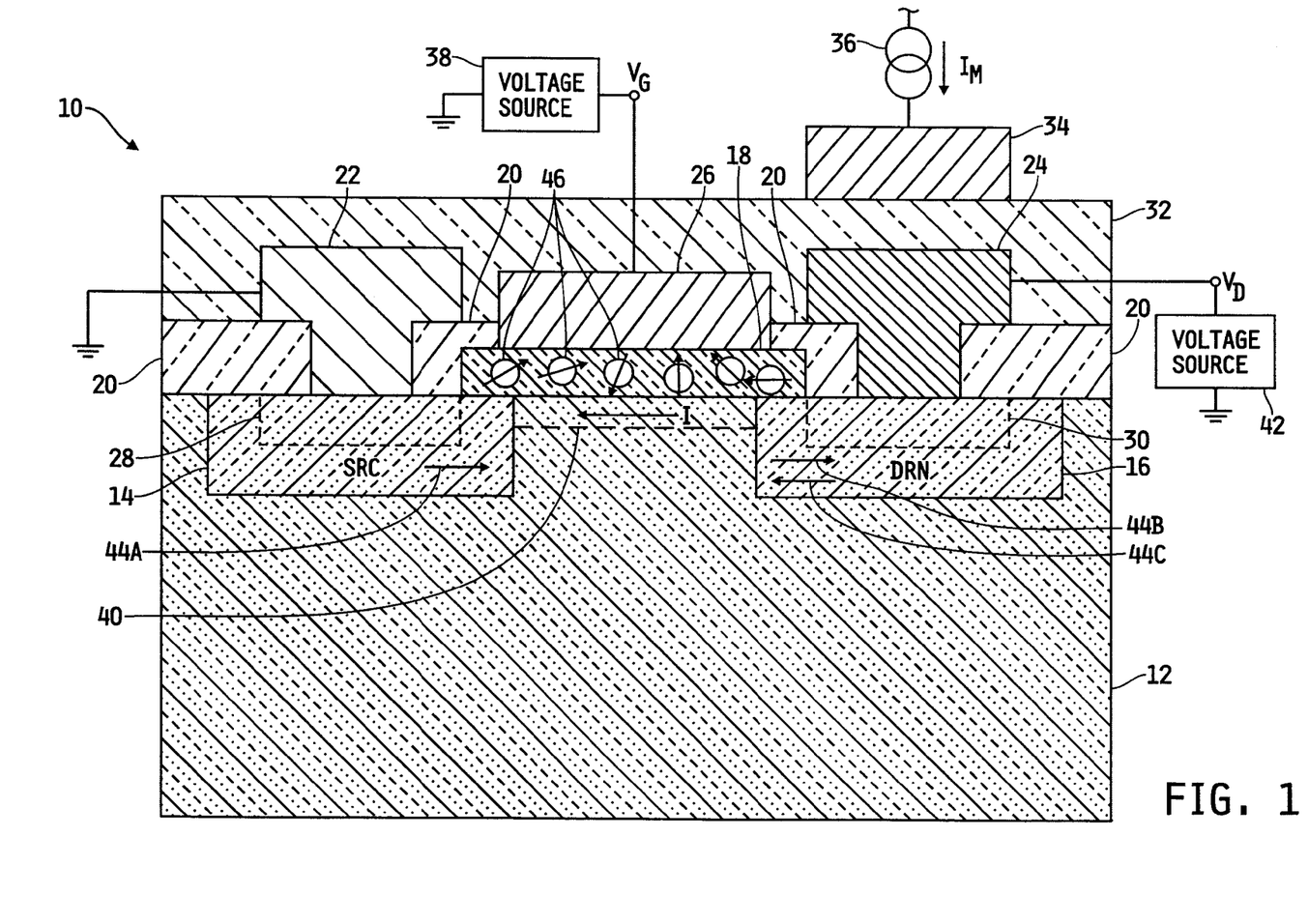
FIG. 1 is a cross-sectional view of a transistor device including paramagnetic or spin-flip impurities and having anti-parallel ferromagnetic contacts.

Referring now to FIG. 1, a transistor device 10 is shown that includes paramagnetic or spin-flip impurities and that has anti-parallel ferromagnetic contacts. In the illustrated embodiment, the transistor 10 is configured similarly to a conventional metal-oxide-semiconductor field effect transistor (MOSFET) in that is has a semiconductor substrate, semiconductor source and drain regions 14 and 16 respectively formed in the substrate 12, a gate oxide layer 18 formed over the substrate 12 between the source and drain regions 14 and 16, and a conventional metal gate 26 formed on the gate oxide layer 18. The substrate 12, source 14 and drain 16 may be formed of conventionally doped silicon to form a conventional n-channel or p-channel MOSFET. Alternatively, the substrate 12, source 14 and drain 16 may be formed of other known semiconductor materials and/or combinations thereof, including, for example, but not limited to, gallium arsenide that is suitably doped with conventional gallium arsenide doping elements or compounds. In any such case, the source and drain 14 and 16 respectively will generally be highly electrically conductive regions and the substrate 12 will generally be a relatively lower electrically conductive region.

Conventional field oxide 20 is formed over the substrate 12, the source 14 and the drain 16, and vias are selectively established through the field oxide layer 20 in a conventional manner to allow for electrical contacts to the source and drain regions 14 and 16 respectively. In the illustrated embodiment, a ferromagnetic film 22 is formed over the source region 14 and electrically contacts the source region 14. In one embodiment, the ferromagnetic film 22 has a high coercivity, and the film 22 may accordingly be formed from a conventional hard or permanent magnet compound or material. Another ferromagnetic film 24 is formed over the drain region 16 and electrically contacts the drain region 16. In one embodiment, the ferromagnetic film 24 has a low coercivity relative to that of the ferromagnetic film 22, and the film 24 may accordingly be formed from a conventional soft magnet compound or material. The low coercivity of the ferromagnetic film 24 allows switching of the magnetic orientation of the film 24 at a lower magnetic field that that required to switch the magnetic orientation of the film 22, so that the magnetic orientation of the film 24 may be selectively oriented relative to that of the film 22 as will be described in greater detail hereinafter. In any case, another conventional field oxide layer 32 is formed over the source contact 22, the drain contact 24 and the gate contact 26. A conventional metal trace or wire 34 is formed over the drain contact 24 with the field oxide 32 disposed therebetween.

A conventional current source, $I_M$, 36 is electrically connected to the metal trace or wire 34. A conventional voltage source 38 has an output that is electrically connected to the gate contact 26, and the voltage source 38 is configured to selectively apply a gate voltage, $V_G$, to the gate contact 26. The gate voltage, $V_G$, is generally selected to have a magnitude that is sufficient to induce an electrically conductive channel 40 in a channel region of the substrate 12 defined between the source and drain regions 14 and 16 respectively. The electrically conductive channel 40 is generally established at the interface of the substrate 12 and the gate oxide 18 as is known in the art. Another conventional voltage source 42 has an output that is electrically connected to the drain contact 24, and the voltage source 42 is configured to selectively apply a drain voltage, $V_D$, to the drain contact 24. The source contact 22 is electrically connected to a reference potential, e.g., ground potential. Alternatively, the output of the voltage source 42 may be electrically connected to the source contact 22, and the drain contact 26 may be electrically connected to a reference potential, e.g., ground potential.

Assuming for now that the structures 46 (i.e., paramagnetic impurities, as will be described in detail hereinafter) illustrated in FIG. 1 are not present in the gate oxide 18, the remaining structure of the transistor device 10 described thus far represents a conventional spin-injected FET. When a suitable gate voltage, $V_G$, is applied to the gate contact 26, an electrically conductive channel 40 is established between the source and drain regions 14 and 16 respectively as described hereinabove. A suitable drain voltage, $V_D$, applied to the ferromagnetic drain contact 24 provides spin polarized current carriers to the conductive channel 40. If the magnetic orientation of the ferromagnetic source 22 is in an "up" direction; one that is perpendicular to the axis of the conductive channel 40 as indicated by the arrow 44A (e.g., the "right" arrow 44A corresponds to a direction that is perpendicular to the plane of FIG. 1), the conductive channel 40 then has two stable electrical conductance states depending upon the magnetic orientation of the ferromagnetic drain contact 24. If the magnetic orientation of the ferromagnetic drain contact 24 is also in the "up" direction, i.e., perpendicular to the axis of the conductive channel 40 as indicated by the arrow 44B, the magnetic orientations of the paramagnetic source contact 22 and the paramagnetic drain contact 24 are said to be "parallel." With parallel magnetic orientations of the source and drain contacts 22 and 24 respectively, the conductive channel 40 has high electrical conductivity. If, on the other hand, the magnetic orientation of the ferromagnetic drain contact 24 is the "down" direction as indicated by the arrow 44C, the magnetic orientations of the ferromagnetic source contact 22 and the paramagnetic drain contact 24 are said to be "anti-parallel." With anti-parallel magnetic orientations of the source and drain contacts 22 and 24 respectively, the conductive channel 40 has lower electrical conductivity relative to the channel conductivity in the parallel orientation. As a result, the source/drain current, I, in the parallel configuration (P) is greater than that in the anti-parallel configuration (A), or in mathematical notation, $I_P > I_A$, where $I_P$ is the source/drain current in the parallel configuration and $I_A$ is the source/drain current in the anti-parallel configuration.

The ferromagnetic material forming the source contact or film 22 is typically selected to have a relatively large coercivity with a magnetic axis that is oriented in a direction that is perpendicular (up or down) to the axis of the conductive channel 40. The ferromagnetic material forming the drain contact or film 24 is typically selected to have a relatively small coercivity with a magnetic axis that is normally aligned parallel with that of the source contact or film 22 but that may be easily oriented anti-parallel to that of the source contact or film 22. In the embodiment illustrated in FIG. 1, for example, the current source, $I_M$, is pulsed with a suitable magnitude and polarity to create a magnetic field in the field oxide layer 32 that inductively couples to the drain contact or film 24 to change the magnetic orientation of the drain contact or film 24 from parallel to anti-parallel relative to the magnetic orientation of the source contact or film 22. Alternative conventional techniques and/or structures may be used for creating a magnetic field in the vicinity of the drain contact or film 24 that is suitable to change the magnetic orientation of the drain contact or film 24 from parallel to anti-parallel relative to the source contact or film 22. Examples of such alternative techniques or structures include, but are not limited to, creating the magnetic field from a suitably placed conventional magnet structure, or the like.

The magnetoresistance ratio, r, is generally understood to be a ratio of the total decrease of electrical resistance as an applied magnetic field is increased to saturation and electrical resistance measured in the state of parallel magnetization. This ratio, r, may be used with the transistor device 10 of FIG. 1 as a measure of the efficiency of the ferromagnetic contacts 22 and 24 in providing spin polarized injection of charge carriers. The source/drain current in the parallel and anti-parallel configurations may be related as a function of the magnetoresistance ratio, r, according to the equation:

$$I_A = I_P(1-r), \text{ where } 0 < r < 1 \quad (1).$$

In terms of a simple circuit model of the transistor device 10 wherein $g_a$ denotes a contact resistance of the ferromagnetic contacts or films 22 and 24 with the source and drain regions 14 and 16 respectively that is associated with the majority spin, and $g_b$ denotes the contact resistance of the ferromagnetic contacts or films 22 and 24 with the source and drain regions 14 and 16 respectively that is associated with the minority spin, terminal conductances in the parallel and anti-parallel configurations, denoted $G_P$ and $G_A$ respectively, may be defined according to the equations:

$$G_P = (g_a + g_b)/2, \; G_A = 2g_a g_b/(g_a + g_b) \quad (2).$$

A contact polarization parameter, $P_C$, can then be defined as $P_C \equiv (g_a - g_b)/(g_a + g_b)$, and the terminal conductances $G_A$ and $G_P$ may be expressed as a ratio defined by the equation:

$$G_A/G_B = 1 - P_C^2 \quad (3).$$

Referring again to FIG. 1, the gate oxide layer 18 of the transistor device 10 further includes a number of paramagnetic impurities 46. The number of paramagnetic impurities 46 may be manifested as defects within the gate oxide 18 and/or at the interface of the gate oxide 18 and the substrate 12, and may occur naturally or inadvertently during the fabrication of the device 10 and/or may be intentionally created during and/or after the device 10 is fabricated using known techniques. In any case, the number of paramagnetic impurities 46 each represent charge traps having two possible charge states as described hereinabove in the BACKGROUND section. In one charge state, corresponding to an "empty" charge trap, the charge trap contains one trapped charge, 1e⁻, and in the other charge state, corresponding to a "filled" or "full" charge trap, the charge trap contains two trapped charges, 2e⁻. It is generally known that filled charge traps repel electrons, thereby reducing the average current flowing through the conductive channel 40 between the source and drain regions 14 and 16 respectively, whereas empty charge traps attract electrons, thereby increasing the average current flowing through the conductive channel 40.

At a sufficiently high gate voltage, $V_G$, the Fermi level, $E_F$, of the channel 40 is substantially greater than the trap level, $E_T$, of the charge trap, and the charge trap is therefore nearly always filled. Conversely, at a sufficiently low gate voltage, $V_G$, the Fermi level, $E_F$, of the channel 40 is substantially less than the trap level, $E_T$, of the charge trap, and the charge trap is therefore nearly always empty. At some gate voltage, $V_G$, that is between the sufficiently high gate voltage and the sufficiently low gate voltage, the Fermi level, $E_F$, of the channel 40 is sufficiently close to the trap level, $E_T$, that the probability of the trap being full or empty is approximately 50%.

As described hereinabove, the two possible charge states of a paramagnetic impurity correspond to two spin states, and electrons interacting with the paramagnetic impurities can cause the paramagnetic impurities to flip from one of the spin states to the other. The spin states generally have equal energy, with one of the spin states being designated as "up" and the other spin state being designated as being "down." The probability that a charge trap is fuel or empty being approximately 50% corresponds to 50% of the paramagnetic impurities being up and 50% of the paramagnetic states being down. This is generally referred to as the relaxed or "unpolarized" state of a paramagnetic impurity, and in this unpolarized state the number of paramagnetic impurities 46 are effective in flipping electronic spins, also referred to as spin flip scattering. Conversely, as the probability that a charge trap is full gets closer to 1, such that the probability of the paramagnetic impurities being up likewise gets closer to 1, the paramagnetic impurity is said to be polarized, and ceases to become effective in flipping electronic spins. As long as external forces are effective in maintaining the paramagnetic impurities in their unpolarized states, spin flip scattering occurs and the source/drain current flowing through the conductive channel 40 is relatively large. However, as the paramagnetic impurities become polarized, spin flip scattering reduces and the source/drain current flowing through the conductive channel 40 is reduced relative to the source/drain current when the paramagnetic impurities are unpolarized. The source/drain current is accordingly sensitive to the degree of spin flip scattering.

Returning again to the simple circuit model, the spin-flip processes just described may be introduced into the model by including a spin-flip conductance, $g_y$, that bridges the up spin and down spin channels. By including the spin-flip conductance parameter, $g_y$, it can be shown that equations (2) become:

$$G_P = (g_a + g_b)/2, \; G_A = [(g_a^2 + g_b^2)g_y + 2g_y g_b(g_a + g_b + g_y)]/(g_a + g_b)(g_a + g_b + g_y) \quad (4).$$

It should be noted from equations (4) that the parallel conductance, $G_P$, is independent of spin flip scattering because the spin flip conductance, $g_y$, in the model bridges two points that are at the same potential halfway between the source and drain contacts. While this may not be precisely true in real devices, it demonstrates that the ant-parallel conductance, $G_A$, is much more dependent on spin flip scattering and, as such, the transistor device 10 of FIG. 1 should be set up to operate strictly in the anti-parallel configuration. The ability to polarize paramagnetic impurities, as well as to detect polarization of paramagnetic impurities, would be significantly, is significantly greater in the anti-parallel configuration than in the parallel configuration. In this regard, an alternative structure of the transistor device 10 may omit the current source 36 and the metal layer or wire 34, and the low coercivity ferromagnetic drain contact or film 24 may be replaced with a ferromagnetic contact or film having a higher coercivity, e.g., equal to that of the ferromagnetic source contact or film 22. In this embodiment, the ferromagnetic drain contact or film would be selected and/or configured such that the magnetic orientation of the ferromagnetic drain contact or film is anti-parallel relative to that of the ferromagnetic source contact or film. In this alternative embodiment, the ferromagnetic contacts or films 22 and 24 may thus be formed from hard or permanent magnet compounds or materials, and are in any case non-adjustably configured in an anti-parallel configuration relative to each other. As such, the current source 36 and metal line or wire 34 are no longer needed, and the transistor device 10 is configured to operate strictly in an anti-parallel configuration. In any case, from equations (4), the conductance ratio $G_A/G_P$ of equation (3) becomes:

$$G_A/G_P = 1 - (g_a + g_b) P_C^2 / (g_a + g_b + 2g_y) \quad (5).$$

The paramagnetic impurities 46 will randomize the spin only if there are external forces constantly maintaining them in an equilibrium state with the fraction of the paramagnetic impurities 46 that point up, $F_U$, equal to the fraction of the paramagnetic impurities 46 that point down, $F_D$. However, if the paramagnetic impurities 46 are weakly coupled to the surroundings (other than the conduction electrons), the paramagnetic impurities 46 will reach a steady-state polarization with $F_U \neq F_D$ such that there is no further spin flip scattering. The transistor device 10 may be activated or turned on by applying a suitable gate voltage, $V_G$, that causes the Fermi level, $E_F$, of the conductive channel 40 to be approximately equal to the trap level, $E_T$, of the one or more paramagnetic impurities 46. The initial conductance ratio $G_A/G_P$ when the transistor device 10 is turned on will thus have an initial value given by equation (5) because the unpolarized paramagnetic impurities will undergo spin flip scattering as described hereinabove. However, as the paramagnetic impurities 46 become polarized by the flow of the source/drain current, I, the conductance ratio $G_A/G_P$ will reach the value given by equation (3). By configuring the transistor device 10 in the anti-parallel configuration, polarization of the paramagnetic impurities 46 becomes channel bias-dependent, and this phenomenon is clearly observable through its effect on the source/drain current.

Extending equation (1) to include the effects of spin-flip scattering of the number of paramagnetic traps 46, the source drain current, $I_A$, in the anti-parallel configuration increases to:

$$I_{AS} = I_P(1 - r/(1+s)) \quad (6),$$

where s is a dimensionless parameter that represents the average number of spin flip scattering events experienced by an electron as it travels between the source 14 and drain 16. According to equation (6), the spin flip scatterers reduce the effective magnetoresistance ratio from "r" to R/(1+s). However, as the paramagnetic impurities 46 become polarized by the flow of the source/drain current, the source/drain current is reduced to the value given by equation (1).

From a practical standpoint, it is desirable to design the transistor device 10 to produce a detectable difference in the source/drain current between the non-polarized (initial) paramagnetic trap state and the polarized (steady-state) paramagnetic trap state; in other words to design the device 10 such that $I_A$ can be easily distinguished from $I_{AS}$. Illustratively, this may be accomplished, for example, by maximizing the difference between equations (6) and (1), which leads to maximizing the equation:

$$I_{AS} - I_A = I_P r s / (1+s) \quad (7).$$

This requires good spin-polarized contacts between the ferromagnetic contact or film 24 and the drain region 16 and between the ferromagnetic contact or film 22 and the source region 14 so that r is as close to 1 as possible. Maximizing equation (7) further requires maximizing the parameter s, corresponding to the average number of spin flip events experienced by a transitioning electron. It bears pointing out that while low resistance electrical contacts between the ferromagnetic source contact or film 22 and the source region 14, and also between the ferromagnetic drain contact or film 24, may maximize $I_P$, high resistance contacts may alternatively be used. Even though such high resistance contacts may reduce $I_P$, and therefore the overall source/drain current level, they also serve to trap electrons in the conductive channel 40 for longer periods of time than with low resistance contacts, thereby increasing their likelihood of experiencing a spin-flip scattering process as measured by the parameter s and hence the relative change in the current $(I_{AS} - I_A)/I_A$. Accordingly, FIG. 1 is illustrated as having high resistance, e.g., Schottky barrier, contacts between the paramagnetic source contact or film 22 and the source region 14 and between the paramagnetic drain contact or film 24 and the drain region 16. Optionally, as also illustrated in phantom in FIG. 1, the source region 14 may alternatively have a highly doped or other low-resistance region 28 formed in/on the source region 14, in which case the low-resistance region 28 provides for a low resistance electrical contact between the paramagnetic source contact or film 22 and the source region 14. Similarly, the drain region 16 may alternatively have a highly doped or other low-resistance region 30 formed in/on the drain region 16, as also shown in phantom in FIG. 1, in which case the low-resistance region 30 provides for a low resistance electrical contact between the paramagnetic drain contact or film 24 and the drain region 16.

Once the paramagnetic impurities 46 become polarized under steady-state operation of the transistor device 10 in its on state as described above, it can be shown that the conductive channel 40 has a zero-bias source/drain current, i.e., that $I(V_D=0) \neq 0$. It can further be shown, according to the model described herein, that the zero-bias source/drain current, $I(V_D=0)$, in the anti-parallel configuration of the transistor device 10, is given by the equation:

$$I(V_D=0) = I_y(g_a - g_b)/(2g_y + g_a + g_b) \quad (8),$$

wherein the model is modified to include a current generator $I_y$, in parallel with the conductance, $g_y$, and having a value that is proportional to $(F_U - F_D)$.

Figure 2:
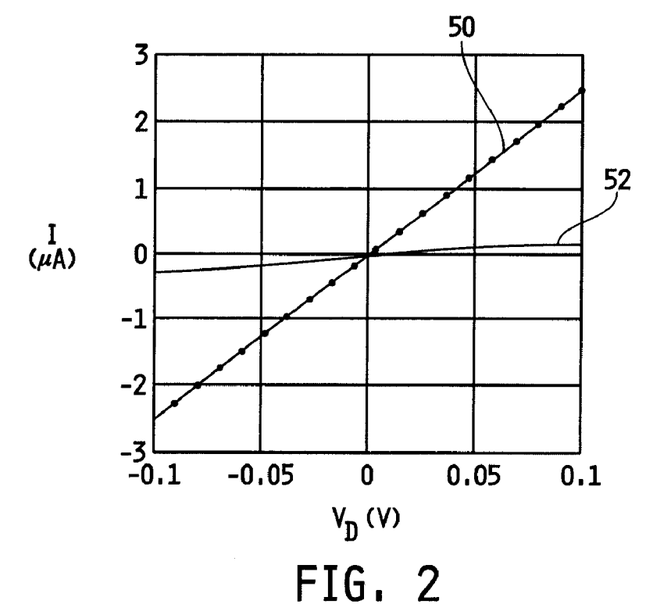
FIG. 2 is a plot of drain current vs. source-to-drain voltage illustrating transient and steady state drain currents for the transistor device of FIG. 1.
Figure 3:
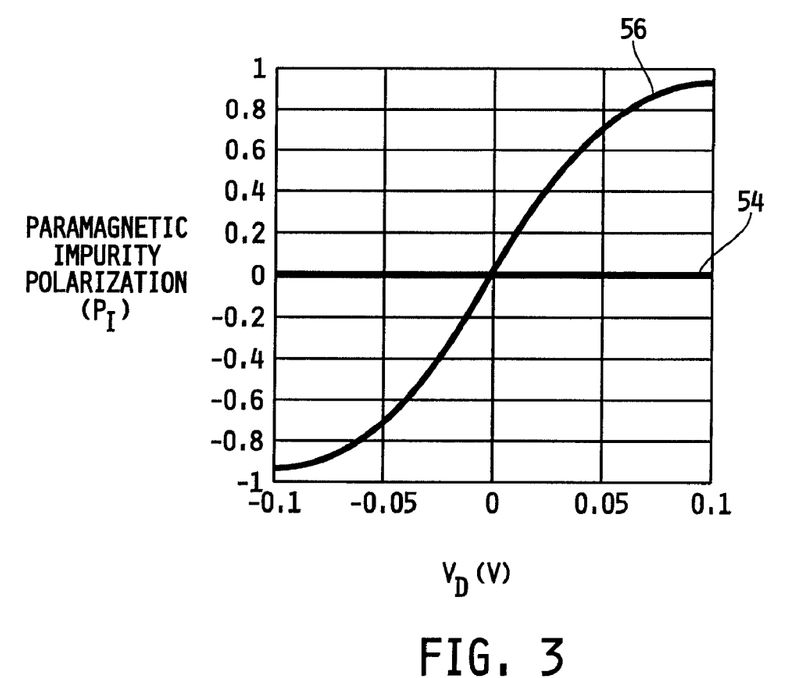
FIG. 3 is a plot of paramagnetic impurity polarization vs. source-to-drain voltage illustrating transient and steady state polarization effects in the transistor device of FIG. 1.

Referring now to FIG. 2, a plot of source/drain current, I, vs. the source/drain voltage, $V_D$, produced by the voltage source 42 is shown. The curve 50 represents the source/drain current, $I_{AS}$, of equation (6), which corresponds to the source/drain current of the device 10 as a function of $V_D$ just after a gate voltage, $V_G$, is applied so that the number of paramagnetic impurities 46 are unpolarized and are therefore effective spin flip scatterers. The curve 52 represents, in contrast, represents the source/drain current, $I_A$, of equation (1), which corresponds to the steady-state source/drain current of the device 10 as a function of $V_D$ after the number of paramagnetic impurities 46 have polarized are therefore no longer effective spin flip scatterers. FIG. 3 is a plot of polarization of the number of paramagnetic impurities 46 vs. source/drain voltage, $V_D$, and the curve 54 represents the unpolarized state of the number of paramagnetic impurities just after a gate voltage, $V_G$, is applied, and the curve 56 represents the polarization of the number of paramagnetic impurities 46 as a function of $V_D$. It should be noted that the number of paramagnetic impurities polarize to a +1 state under sufficiently high values of $V_D$, and conversely polarize to a -1 state under sufficiently low values of $V_D$.

It can be shown that the time constant, $T_C$, for the transition of the source/drain current from its initial value, e.g., given by equation (6), following application of the gate voltage, $V_G$, to turn on the transistor device 10, to its steady state value, e.g., given by equation (1) can be approximated by the equation:

$$T_C = 2yAk_BT/N_I \qquad (9),$$

where y is the spin flip rate and $(2Ak_BT/N_I)$ represents the ratio of the number of conduction electrons $2Ak_BT$ involved in spin flip processes to the number of paramagnetic impurity spins, $N_I$, with which they interact.

The transistor device 10 illustrated and described herein is a MOSFET including a number of paramagnetic or spin flip impurities 46 and having anti-parallel source and drain contacts 22 and 24 respectively. The source/drain current flowing in an electrically conductive channel 40 established between the source region 14 and the drain region 16 is sensitive to the degree of spin flip scattering of the number of paramagnetic impurities 46. As long as external sources can maintain the paramagnetic impurities in an unpolarized state, they act as spin flip scatterers and a relatively large source/drain current flows through the conductive channel 40. However, if the rate of information erasure from the number of paramagnetic impurities cannot keep up with the information input from the electrons, such as occurs in the steady-state under the influence of the source/drain voltage, the number of paramagnetic impurities will polarize and cease to act as spin flip scatterers, and the source/drain current will be reduced as a result.

As described herein, the source/drain current of the transistor 10 takes on an initial value, e.g., $I_{AS}$, when a suitable gate voltage, $V_G$, is applied to the gate 26 with a voltage, $V_D$, established between the ferromagnetic source contact or film 22 and the ferromagnetic drain contact or film 26, and the number of paramagnetic impurities 46 act as effective spin flip scatterers. As the number of paramagnetic impurities 46 begin to polarize under the influence of the source/drain voltage, $V_D$, the source/drain current begins to decrease from its initial value. When the number of paramagnetic impurities 46 become polarized in the steady state and cease to act as spin flip scatterers, the source/drain current is reduced to a steady state value, e.g., $I_A$. The time constant, $T_C$, of the decay of the source/drain current between its initial value and its steady state value is given by equation (9). The zero-bias or short circuit source/drain current, $I(V_D=0)$, after the source/drain current reaches its steady state value, is non-zero according to equation (8). Thus, if the source/drain voltage, $V_D$, is removed, the depolarization of the number of paramagnetic impurities resulting from interactions with the channel electrons induces the zero-bias current in the conductive channel 40, which may be used to deliver energy to an external load. The transistor device 10 may thus be implemented, in one illustrative embodiment, as a so-called spin capacitor, wherein the transition of the source/drain current to its steady state value as the number of paramagnetic impurities polarize "charges" the spin capacitor, and removing the source/drain voltage, $V_D$, and allowing the zero-bias current induced in the conductive channel 40 to deliver energy to an external load "discharges" the spin capacitor.

Figure 4:
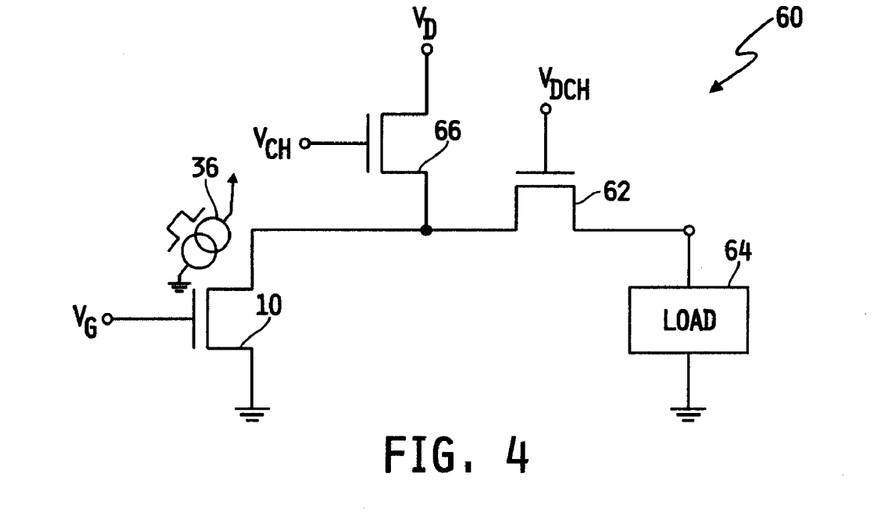
FIG. 4 is a schematic diagram of one illustrative embodiment of an electrical circuit implementing the transistor device of FIG. 1 as a capacitor.

Referring now to FIG. 4, a schematic diagram of one illustrative embodiment of an electrical circuit 60 implementing the transistor device 10 of FIG. 1 as a spin capacitor is shown. In the illustrated embodiment, the source or drain of the transistor device 10 is electrically connected to ground potential, and the remaining drain or source is electrically connected to a source of a conventional n-channel MOSFET 62 and to a drain of a conventional p-channel MOSFET 66. The drain of the MOSFET 62 is electrically connected to an electrical load 64 that may be included on-board an integrated circuit on which the circuit 60 may be fabricated, or that may be external to the circuit 60. The source of the p-channel MOSFET 66 is electrically connected to a voltage source producing the voltage $V_D$ described hereinabove. The gate of the MOSFET 62 is controlled by a discharge voltage, $V_{DCH}$, and the gate of the MOSFET 66 is controlled by a charge voltage, $V_{CH}$. In operation, the gate voltage, $V_G$, of the transistor device 10, the discharge voltage, $V_{DCH}$, and the charge voltage, $V_{CH}$, are all sufficiently low so that the transistor device 10 and the MOSFET 62 are initially both in their off states and the MOSFET 66 is in its on state supplying the voltage, $V_D$, to the transistor device 10. The spin capacitor/transistor device 10 is charged by applying a suitable gate voltage, $V_G$, to the gate of the transistor device 10 so that the transistor device 10 turns on and establishes a conductive channel 40 between the source and drain as described hereinabove. The spin capacitor/transistor device 10 "charges" as the initial source/drain current decreases from its initial value to its steady state value. The charge stored in the spin capacitor/transistor device 10 may then be discharged into the electrical load 64 by controlling the voltages $V_{CH}$ and $V_{DCH}$ to sufficiently high values to turn off the MOSFET 66 and to turn on the MOSFET 62. This removes the source/drain voltage from the spin capacitor/transistor device 10 and connects the source and drain of the spin capacitor/transistor device 10 across the electrical load 64. Upon removal of $V_D$ from the spin capacitor/transistor device 10, subsequent depolarization of the number of paramagnetic impurities resulting from interactions with the channel electrons induces the zero-bias current in the conductive channel 40, which is electrically connected to the electrical load. The zero-bias current is thus delivered to an electrical load 64 as the spin capacitor/transistor device 10 discharges. This cycle may be repeated any number of times, and the speed of this cycle is dependent upon the time constant, $T_C$, corresponding to the charge time of the spin capacitor/transistor device 10 and the discharge time of the spin capacitor/transistor device 10 into the electrical load 64.

The transistor device 10 may alternatively or additionally be implemented, in another illustrative embodiment, as a memory element, wherein one logic state of the memory element corresponds to the zero-bias current induced in the conductive channel of the transistor device 10 and the opposite logic state corresponds to the lack of any current flow in the conductive channel of the transistor device.

Figure 5:
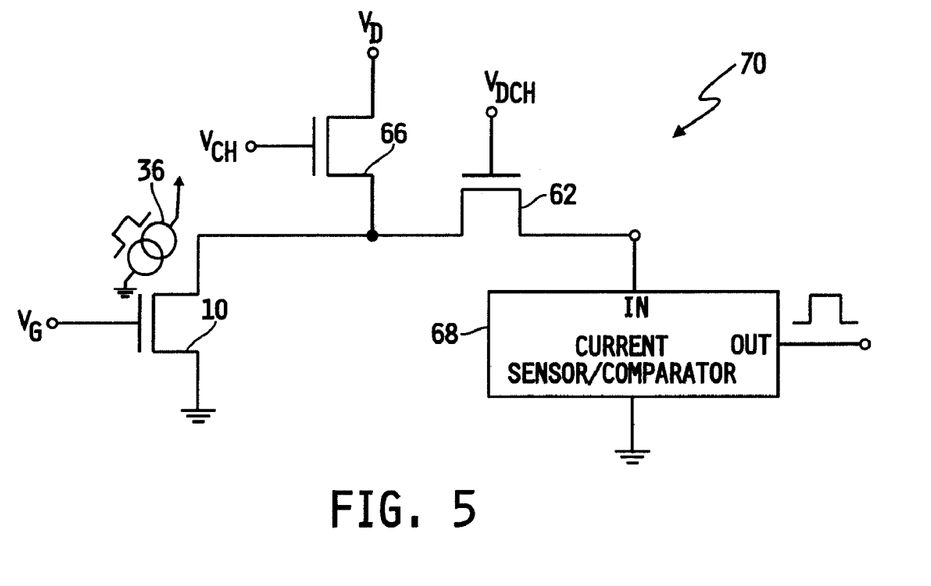
FIG. 5 is a schematic diagram of one illustrative embodiment of another electrical circuit implementing the transistor device of FIG. 1 as a memory element.

Referring now to FIG. 5, a schematic diagram of one illustrative embodiment of an electrical circuit 70 implementing the transistor device 10 of FIG. 1 as a memory element as just described is shown. In the illustrated embodiment, the electrical circuit 70 is identical to that of the electrical circuit 60 except that the electrical load 64 is replaced with a current sensor and comparator circuit 68. In operation, one logic state may be written to the memory element/transistor device 10 by controlling the gate voltage, $V_G$, of the transistor device 10 to a sufficiently high value so that the transistor device 10 turns on to form the conductive channel 40, controlling the charge voltage, $V_{CH}$, to a sufficiently low value to turn on the MOSFET 66 and controlling the discharge voltage, $V_{DCH}$, to a sufficiently low value to turn off the MOSFET 62. After the time constant, $T_C$, elapses, the source/drain current of the memory element/transistor device 10 will be at its steady state value. The opposite logic state may be "written" to the memory element/transistor device 10 by controlling the gate voltage, $V_G$, and the discharge voltage, $V_{DCH}$, to sufficiently low voltages so that the transistor device 10 is turned off and no source/drain current flows between the source and drain thereof, and the MOSFET 62 is turned off to isolate the current sensor and comparator circuit 62 from the MOSFET 66 and the transistor device 10. Alternatively, the opposite logic state may be "written" to the memory element/transistor device 10 by controlling the gate voltage, $V_G$, and the charge voltage, $V_{CH}$, to sufficiently high voltages so that the transistor device 10 is turned on and the MOSFET 66 is turned off so that the source/drain voltage $V_D$ is not applied by the MOSFET 66 to the memory element/transistor device 10. The voltage $V_{DCH}$ may be controlled to a sufficiently low state such that the MOSFET 62 is turned off to isolate the current sensor and comparator circuit 62 from the MOSFET 66 and the transistor device 10. In any case, the "contents" of the memory element/transistor device 10 may be "read" by controlling the gate voltage, $V_G$, and the charge voltage, $V_{CH}$, to sufficiently high voltages so that the transistor device 10 is turned on to establish the conductive channel 40 and the MOSFET 66 is turned off so that the voltage $V_D$ is not applied by the MOSFET 66 to the memory element/transistor device 10. The voltage $V_{DCH}$ is controlled to a sufficiently high state such that the MOSFET 62 is turned on to electrically connect the source and drain of the memory element/transistor device 10 across the current sensor and comparator circuit 68. If the steady state source/drain current had been flowing through the memory element/transistor device 10 prior to the "read" operation, the zero-bias current will be induced in the conductive channel of the memory element/transistor device 10, as described hereinabove, during the read operation and this current will be directed through the MOSFET 62 to the current sensor and comparator circuit 68. If, on the other hand, no current had been flowing through the memory element/transistor device 10 prior to the read operation, then no current will flow from the memory element/transistor device 10 to the current sensor and comparator circuit 68 during the read operation. The current sensor and comparator circuit 68 includes conventional current sensing and comparator circuitry configured to compare the current sensed by the current sensing circuitry to a threshold current value. In this embodiment, the threshold current value may be set to some value that is less than the zero bias current of the memory element/transistor device 10. If the zero bias current is directed to the current sensor and comparator circuit 68 during the read operation, this current will be above the current threshold value and the current sensor and comparator circuitry 68 will determine that this condition corresponds to the one logic state of the memory element/transistor device 10. If no current is directed to the current sensor and comparator circuit 68 during the read operation, the current sensor and comparator circuit 68 will determine that this condition corresponds to the opposite logic state of the memory element/transistor device 10.

It will be understood that the electrical circuit 70 may be alternatively configured to "write" logic states to, and "read" logic states from, the memory element/transistor device 10 in a different manner than that just described. In one alternative embodiment, for example, the gates of the various transistors 10, 62 and 66 may be controlled such that the initial value of the source/drain current of the transistor device 10, as this initial value is described hereinabove, corresponds to one logic state of the memory element/transistor device 10 and the steady state value of the source/drain current of the transistor device 10, as this steady state value is described hereinabove, corresponds to the opposite logic state of the memory element/transistor device 10. The current sensor and comparator circuit 68 will, in such an alternative embodiment, be modified to discriminate between the initial and steady state source/drain current values so that the two opposite logic states may be determined during a read operation. Other combinations of the initial current, steady state current or no source/drain current conditions of the memory element/transistor device 10 may be used to "write" logic states to the memory element/transistor device 10 and to "read" logic states from the memory element/transistor device 10, and such other combinations are contemplated by this disclosure.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

What is claimed is:

1. A transistor device comprising:
   a first semiconductor region,
   a first ferromagnetic member electrically contacting the first semiconductor region and having a first coercivity,
   a second semiconductor region,
   a second ferromagnetic member electrically contacting the second semiconductor region and having a second coercivity that is smaller than the first coercivity,
   a third semiconductor region separating the first and second semiconductor regions,
   an electrically conductive gate positioned over the third semiconductor region,
   an electrically insulating layer disposed between the gate and the third semiconductor region, the electrically insulating layer including a number of paramagnetic impurities each having two spin states such that electrons interacting with the paramagnetic impurities cause the paramagnetic impurities to flip between the two spin states,
   a first voltage source configured to apply a first voltage to the gate, the first voltage configured to induce an electrically conductive channel in the third semiconductor region, and
   a second voltage source configured to apply a second voltage across the first and second semiconductor regions, the second voltage configured to cause the number of paramagnetic impurities to become spin polarized.

2. The transistor device of claim 1 further comprising means for coupling a magnetic field to the second ferromagnetic member to orient a magnetic orientation of the second ferromagnetic member in an anti-parallel magnetic orientation relative to a magnetic orientation of the first ferromagnetic member.

3. The transistor device of claim 1 wherein the electrical contact between the first ferromagnetic member and the first semiconductor region comprises a high resistance contact,
   and wherein the electrical contact between the second ferromagnetic member and the second semiconductor region comprises a high resistance contact.

4. The transistor device of claim 1 wherein the electrical contact between the first ferromagnetic member and the first semiconductor region comprises a low resistance contact,
   and wherein the electrical contact between the second ferromagnetic member and the second semiconductor region comprises a low resistance contact.

5. The transistor device of claim 1 wherein the second voltage is configured to cause a current to flow through the electrically conductive channel between the first and second semiconductor regions, the current having a magnitude that is sensitive to a degree of flipping of the paramagnetic impurities between the two spin states.

6. The transistor device of claim 1 wherein the second voltage is configured to cause a current to flow through the electrically conductive channel between the first and second semiconductor regions, the current having a magnitude that decreases from a first value before the number of paramagnetic impurities are spin polarized to a second value after the number of paramagnetic impurities are spin polarized.

7. The transistor device of claim 6 wherein the transistor device forms a memory element with the first value of the current corresponding to one logic state of the memory element and the second value of the current corresponding to an opposite logic state of the memory element.

8. The transistor device of claim 1 wherein the second voltage source is configured to apply a second voltage configured to cause the number of paramagnetic impurities to become spin polarized during the first time period such that subsequent depolarization of the number of paramagnetic impurities induces a current to flow through the channel region between the first and second semiconductor regions.

9. The transistor device of claim 8 wherein the transistor device comprises one component of an electrical circuit having an electrical load,
and wherein the induced current is directed from the transistor device to the electrical load.

10. A transistor device comprising:
a source having a first ferromagnetic contact thereto,
a drain having a second ferromagnetic contact thereto, the first and second ferromagnetic contacts having anti-parallel magnetic orientations,
an electrically conductive gate positioned over a channel region separating the source and the drain, and
an electrically insulating layer disposed between the gate and the channel region and including a number of paramagnetic impurities each having two spin states such that electrons interacting with the paramagnetic impurities cause the paramagnetic impurities to flip between the two spin states, the number of paramagnetic impurities being spin polarized.

11. The transistor device of claim 10 wherein a current flowing between the source and the drain has a magnitude that is sensitive to a degree of flipping of the paramagnetic impurities between the two spin states.

12. The transistor device of claim 10 wherein application of a voltage across the source and the drain causes the number of paramagnetic impurities to become spin polarized so that a magnitude of a current flowing through the channel region between the source and the drain decreases from a first value before the number of paramagnetic impurities are spin polarized to a second value after the number of paramagnetic impurities are spin polarized.

13. The transistor device of claim 10 wherein application of a voltage across the source and the drain causes the number of paramagnetic impurities to become spin polarized such that subsequent depolarization of the number of paramagnetic impurities induces current flow through the channel region between the source and the drain.

14. The transistor device of claim 10 further comprising means for coupling a magnetic field to the second ferromagnetic contact to orient a magnetic orientation of the second ferromagnetic member in an anti-parallel magnetic orientation relative to a magnetic orientation of the first ferromagnetic member.

15. The transistor device of claim 10 wherein the electrical contact between the source and the first ferromagnetic contact comprises a high resistance contact,
and wherein the electrical contact between the drain and the second ferromagnetic contact comprises a high resistance contact.

16. The transistor device of claim 10 wherein the electrical contact between the source and the first ferromagnetic contact comprises a low resistance contact,
and wherein the electrical contact between the drain and the second ferromagnetic contact comprises a low resistance contact.

17. The transistor device of claim 10 further comprising a first voltage source configured to apply a first voltage to the gate that induces an electrically conductive channel in the channel region that extends between the source and the drain.

18. The transistor device of claim 17 further comprising a second voltage source configured to apply a second voltage between the source and the drain to cause a current to flow through the electrically conductive channel between the source and the drain, the current having a magnitude that is sensitive to a degree of flipping of the paramagnetic impurities between the two spin states.

19. The transistor device of claim 17 further comprising a second voltage source configured to apply a second voltage between the source and the drain to cause a current to flow through the electrically conductive channel between the source and the drain and to cause the number of paramagnetic impurities to become spin polarized so that a magnitude of the current decreases from a first value before the number of paramagnetic impurities are spin polarized to a second value after the number of paramagnetic impurities are spin polarized.

20. The transistor device of claim 19 wherein the transistor device comprises a memory element with the first value of the current defining one logic state of the memory element and the second value of the current defining an opposite logic state of the memory element.

21. The transistor device of claim 17 further comprising a second voltage source configured to apply a second voltage between the source and the drain to cause the number of paramagnetic impurities to become spin polarized such that subsequent depolarization of the number of paramagnetic impurities induces a current to flow through the conductive channel between the source and the drain.

22. The transistor device of claim 21 wherein the transistor device comprises one component of an electrical circuit having an electrical load,
and wherein the current is directed from the transistor device to the electrical load.

23. The transistor device of claim 21 wherein the transistor device comprises a memory element with the current flowing through the conductive channel defining one logic state of the memory element and negligible current flowing through the conductive channel defining an opposite state of the memory element.

* * * * *